United States Patent
Lee

(10) Patent No.: US 10,491,980 B2
(45) Date of Patent: Nov. 26, 2019

(54) MULTIPLE MEMS MOTOR APPARATUS WITH COMMON VENT

(71) Applicant: Knowles Electronics, LLC, Itasca, IL (US)

(72) Inventor: Sung Bok Lee, Chicago, IL (US)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 15/751,413

(22) PCT Filed: Aug. 3, 2016

(86) PCT No.: PCT/US2016/045383
§ 371 (c)(1),
(2) Date: Feb. 8, 2018

(87) PCT Pub. No.: WO2017/027295
PCT Pub. Date: Feb. 16, 2017

(65) Prior Publication Data
US 2018/0234751 A1  Aug. 16, 2018

Related U.S. Application Data

(60) Provisional application No. 62/203,107, filed on Aug. 10, 2015.

(51) Int. Cl.
*H04R 1/08* (2006.01)
*H04R 19/00* (2006.01)
(Continued)

(52) U.S. Cl.
CPC ............ *H04R 1/08* (2013.01); *B81B 7/0041* (2013.01); *B81B 7/0061* (2013.01);
(Continued)

(58) Field of Classification Search
CPC ...... H04R 1/08; H04R 19/005; H04R 31/006; H04R 1/227; H04R 1/2815; H04R 19/04;
(Continued)

(56) References Cited

U.S. PATENT DOCUMENTS

| 8,618,619 B1 * | 12/2013 | Miks ..................... H04R 1/021 |
| | | 257/414 |
| 8,737,171 B2 | 5/2014 | Jenkins et al. |

(Continued)

FOREIGN PATENT DOCUMENTS

| CN | 101568055 A | 10/2009 |
| CN | 204046818 U | 12/2014 |

(Continued)

OTHER PUBLICATIONS

International Search Report and Written Opinion, PCT/US2016/045383, Knowles Electronics, LLC, 7 pages (Oct. 20, 2016).

*Primary Examiner* — Sean H Nguyen
(74) *Attorney, Agent, or Firm* — Foley and Lardner LLP

(57) ABSTRACT

A first MEMS motor and s second MEMS motor share a common back volume and a common support structure, and the common support structure is configured to support a first diaphragm and the first back plate, and the common support structure is also configured to support the second diaphragm and the second back plate. A channel passes through the common support structure and communicates with the exterior environment, the channel being of a first diameter, the channel being disposed beyond an outer periphery of each back plate. An opening extends through the silicon nitride layer, the opening having a second diameter, the second diameter being less than the first diameter, the channel communicating with the opening. The opening has a length that is orthogonal to second diameter, and the first back plate and the second back plate have a thickness, wherein the length is no greater than twice the thickness. The channel and the opening allow direct communication between the exterior environment and the common back volume.

20 Claims, 2 Drawing Sheets

(51) Int. Cl.
*H04R 31/00* (2006.01)
*B81B 7/00* (2006.01)
*H04R 1/22* (2006.01)
*H04R 19/04* (2006.01)
*H04R 1/28* (2006.01)

(52) U.S. Cl.
CPC ......... *H04R 19/005* (2013.01); *H04R 31/006* (2013.01); *B81B 2201/0257* (2013.01); *B81B 2203/0127* (2013.01); *H04R 1/227* (2013.01); *H04R 1/2815* (2013.01); *H04R 19/04* (2013.01); *H04R 2201/003* (2013.01); *H04R 2410/03* (2013.01)

(58) Field of Classification Search
CPC .......... H04R 2201/003; H04R 2410/03; B81B 7/0041; B81B 7/02; B81B 2001/0257
USPC ........................................................ 381/174
See application file for complete search history.

(56) References Cited

U.S. PATENT DOCUMENTS

| | | |
|---|---|---|
| 2010/0158281 A1 | 6/2010 | Lee et al. |
| 2010/0303273 A1 | 12/2010 | Sawada |
| 2012/0266684 A1* | 10/2012 | Hooper ................. G01L 9/0052 73/721 |
| 2013/0051598 A1* | 2/2013 | Reining ................ B81B 7/0061 381/355 |
| 2013/0241045 A1* | 9/2013 | Goida ................... B81B 7/0061 257/704 |
| 2014/0008740 A1* | 1/2014 | Wang ................... B81C 1/00246 257/416 |
| 2014/0084396 A1* | 3/2014 | Jenkins ................. B81B 3/0021 257/419 |
| 2014/0191233 A1* | 7/2014 | Gehl ......................... B81B 7/02 257/48 |
| 2015/0014796 A1 | 1/2015 | Dehe |
| 2015/0043759 A1* | 2/2015 | Koji ..................... H04R 19/005 381/175 |
| 2015/0175404 A1 | 6/2015 | Jenkins et al. |
| 2015/0208174 A1* | 7/2015 | Pinkerton .............. H04R 19/02 381/165 |
| 2016/0150337 A1* | 5/2016 | Nandy ..................... H04R 3/02 381/66 |
| 2016/0176704 A1* | 6/2016 | Cargill ................. H04R 19/005 257/419 |

FOREIGN PATENT DOCUMENTS

| | | |
|---|---|---|
| EP | 2 758 335 A1 | 3/2013 |
| JP | 2007-104466 A | 4/2007 |

* cited by examiner

MULTIPLE MEMS MOTOR APPARATUS WITH COMMON VENT

CROSS-REFERENCE TO RELATED APPLICATIONS

This application is a National Stage Application of PCT/US2016/045383, filed Aug. 3, 2016, which claims the benefit of and priority to U.S. Provisional Patent Application No. 62/203,107, filed Aug. 10, 2015, the entire contents of which are incorporated herein by reference.

TECHNICAL FIELD

This application relates to microphones and, more specifically to microphones with enhanced performance characteristics.

BACKGROUND OF THE INVENTION

Different types of acoustic devices have been used through the years. One type of device is a microphone. In a microelectromechanical system (MEMS) microphone, a MEMS die includes a diaphragm, back plate and a support structure. The MEMS die is supported by a base and is enclosed by a housing (e.g., a cup or cover with walls). A port may extend through the base (for a bottom port device) or through the top of the housing (for a top port device). In any case, sound energy traverses through the port, moves the diaphragm and creates a changing potential between the diaphragm and the back plate, which creates an electrical signal. Microphones are deployed in various types of devices such as personal computers or cellular phones.

Many MEMS microphones have a barometric relief opening through the diaphragm. However, this opening can allow ingress of foreign material into a particularly sensitive part of the microphone structure. The gap between the diaphragm and back plate may be around 4 µm, so is easily filled with contaminants during manufacture or use of the device. These contaminants adversely affected microphone operation.

The problems of previous approaches have resulted in some user dissatisfaction with these previous approaches.

BRIEF DESCRIPTION OF THE DRAWINGS

For a more complete understanding of the disclosure, reference should be made to the following detailed description and accompanying drawings wherein.

Figure 1:
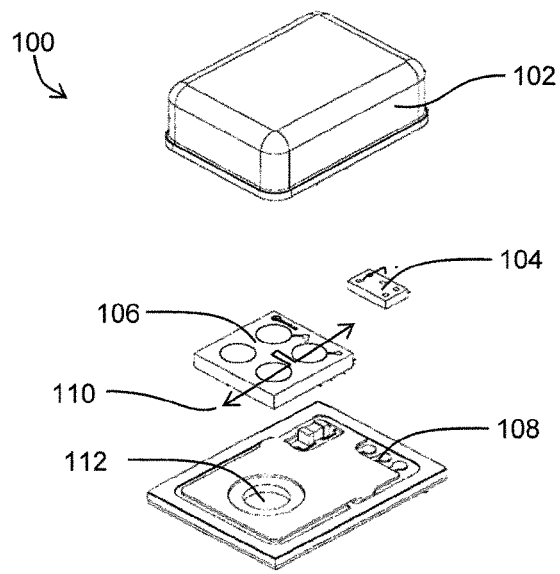
FIG. 1 comprises an exploded view of a microphone assembly with multiple MEMS motors according to various embodiments of the present invention.

Skilled artisans will appreciate that elements in the figures are illustrated for simplicity and clarity. It will further be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION

The present approaches provide a multi-motor micro electro mechanical system (MEMS) microphone apparatus with a short path through the base, the short path being the outer periphery of the back plates used in the multiple motors. The short path adds little or no inertance to the microphone. In these approaches the opening provides a barometric relief opening and does not extend through the diaphragm. Moving the barometric relief opening away from the diaphragm area makes it less likely for contaminants to become trapped between the diaphragm and back plate portion of the MEMs motor.

In one example, four MEMS motors are used. Each MEMS motor includes a diaphragm and a back plate, and is formed on a common substrate. The common substrate provides a support structure for the diaphragms and back plates. The back plate is disposed over the diaphragm. In one aspect, a 1 to 2 µm thick layer of silicon nitride is formed on top of the common substrate to form the back plate. A first opening in the substrate is made in the space between the diaphragms, approximately 80 µm diameter in one example. A small second opening or vent (e.g., 10 to 40 µm) is made in the silicon nitride layer to create a vent hole. The two openings cooperate to provide a path between the exterior environment and the back volume in the microphone. The substrate and diaphragm can be constructed of silicon and the back plate can be constructed of silicon nitride. The common substrate thickness in some examples is 200-400 µm thick. Other examples of materials and dimensions are possible.

Previous systems located vents between the back volume and exterior environment through the diaphragm. In the approaches described herein, disposing the vent in the substrate offers the advantage of reduced sensitivity to contamination such as from solder fumes, due to the distance between the vent area and the sensitive diaphragm area.

In the approaches presented herein, there is a small area of constricted diameter. The length of the constriction (vent or opening) is much smaller than the diameter.

The approaches provide manufacturing advantages over the traditional pierced diaphragm. These approaches provide ingress protection from contaminants for sensitive areas of the microphone especially the volume between the back plate and the diaphragm.

In many of these embodiments, a microphone includes a common base; a common trapped back volume; a common support structure; and a first micro electro mechanical system (MEMS) motor disposed on the common base. The first MEMS motor includes a first diaphragm, and the first diaphragm is arranged to separate the common back volume and a front volume; and a first back plate disposed in parallel relation to the first diaphragm. The microphone also includes a second MEMS motor disposed on the common base. The second MEMS motor includes a second diaphragm, and the second diaphragm is arranged to separate the common back volume and the front volume, and a second back plate that is disposed in parallel relation to the second diaphragm. The first back plate and the second back plate are formed of a material layer, the material layer extending over the common base. The first MEMS motor and the second MEMS motor share the common back volume and the common support structure, and the common support structure is configured to support the first diaphragm and the first back plate, and wherein the common support structure is also configured to support the second diaphragm and the second back plate. A channel passes through the common support structure and communicates with the exterior environment, the channel being of a first diameter, the channel being disposed beyond an outer periphery of each back plate. An opening extends through the silicon nitride layer, the opening having a second diameter, the second diameter being less than the first diameter, the channel communicating with the opening. The opening has a length that is orthogonal to second diameter, and the first back plate and the second back plate have a thickness, wherein the length is no greater than twice the thickness. The channel and the opening allow direct communication between the exterior environment and the common back volume.

In some aspects, the channel is approximately 80 micrometers in diameter. In other aspects, the opening is approximately 10 to 40 micrometers in diameter. In some examples, the diaphragm is constructed of silicon. In other examples, the common support structure is constructed of silicon.

In other aspects, the material layer is silicon nitride. In some examples, the first back plate and the second back plate are approximately 1 to 2 micrometers thick.

In others of these embodiments, a microphone includes a common base; a common trapped back volume; a common support structure; and a first micro electro mechanical system (MEMS) motor disposed on the common base. The first MEMS motor includes a first diaphragm, and the first diaphragm is arranged to separate the common back volume and a front volume, and a first back plate disposed in parallel relation to the first diaphragm. The microphone includes a second MEMS motor disposed on the common base. The second MEMS motor includes a second diaphragm, and the second diaphragm is arranged to separate the common back volume and the front volume, and a second back plate that is disposed in parallel relation to the second diaphragm. The first MEMS motor and the second MEMS motor share the common back volume and the common support structure, and the common support structure is configured to support the first diaphragm and the first back plate. The common support structure is also configured to support the second diaphragm and the second back plate. A channel passes through the common support structure and communicates with the exterior environment, and the channel is of a first diameter, and is disposed beyond an outer periphery of each back plate. An opening extends through the common support structure, the opening having a second diameter. The opening communicates with the common back volume, the second diameter is less than the first diameter, and the channel also communicates with the opening. The channel and the opening allow direct communication between the exterior environment and the common back volume.

Referring now to FIG. 1, a multi-motor MEMS microphone assembly 100 includes a cover (or case) 102, an integrated circuit 104 (ASIC), MEMS motors 106, and a base 108 (made of FR4 in some examples). A port 112 extends through the base 108 and allows sound to be received at the MEMS motors 106. The MEMS motors 106 convert sound into electrical signals that are representative of the sound.

Figure 2:
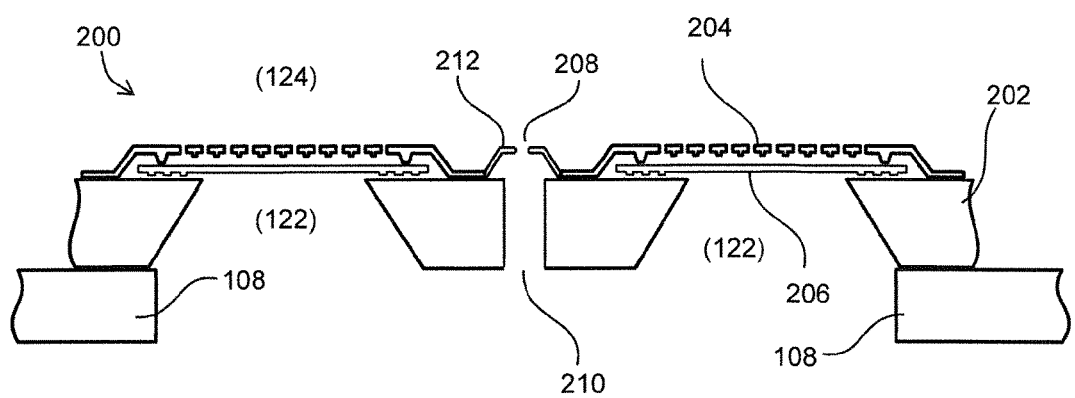
FIG. 2 comprises a cross-sectional view of multiple MEMS motors according to various embodiments of the present invention.
Figure 3:
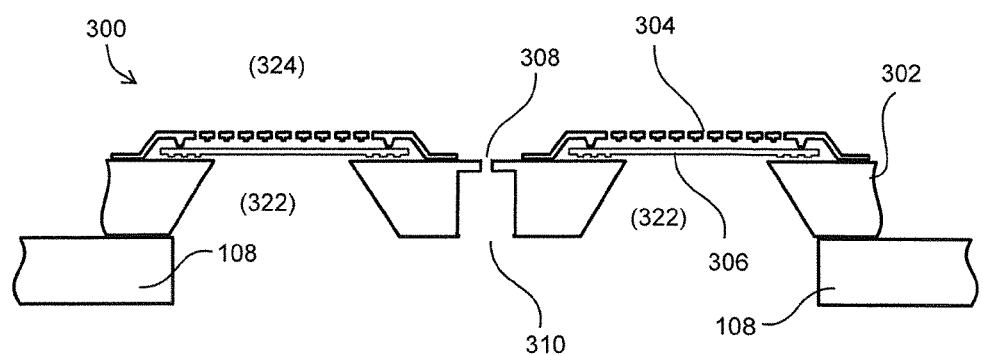
FIG. 3 comprises a cross-sectional view of multiple MEMS motors according to various embodiments of the present invention.

Line 110 is a sectioning line for section views of multiple motor devices such as the examples of FIG. 2 and FIG. 3. That is, the example of FIG. 2 has the exterior view shown in FIG. 1. Additional structures not shown in FIG. 1 are shown in the detailed cross-sectional views of FIG. 2.

Referring now to FIG. 2, one example of a multiple motor structure with a channel shared between multiple motors 106, and outside back plate areas is described. Each motor structure 106 includes a back plate 204, and a diaphragm 206 disposed on a common substrate 202 (e.g., bulk, die, or wafer).

In one aspect, a 1 to 2 µm thick layer of silicon nitride 212 is formed on top of the common substrate 202 to form the back plate 204. The back plate 204 is a portion of the silicon nitride layer 212. Back plate 204 may have a silicon film on one side to act as a conductor. A first channel or opening 210 in the substrate 202 is made in the space between the diaphragms, approximately 80 µm diameter in one example. A small second opening or vent 208 (e.g., 10 to 40 µm) is made in the nitride layer 212 to create the vent hole 208. The diameter of the second opening 208 is much less than the diameter of the first opening 210.

In one example, the substrate 202 and diaphragm 206 are made of silicon and the back plate 204 is made of silicon nitride. Common substrate 202 thickness is 200-400 µm thick in some examples. Front volumes 122 are formed beneath the diaphragm and a common back volume 124 is defined by the motors 106, base 108, and cover 102.

Sound from the exterior environment enters separate front volumes 122 for each motor 106, while the back volume 124 is shared amongst the motors 106.

In operation, the back plates 204 and/or diaphragms 206 may be charged. Sound enters front volumes 122. Movement of the diaphragms 206 by air creates an electrical signal that can be communicated to an integrated circuit 104. Disposing a venting path through the substrate 202 (the venting path being channel 210 and vent or opening 208) offers one advantage of providing a reduced sensitivity to contamination such as from solder fumes, due to the distance between the vent area (i.e., the vent or opening 208) and the sensitive diaphragm area (the diaphragms 206).

Referring now to FIG. 3, another example of a multi-motor microphone with multiple motors 106 is described. Each motor structure 305 includes a back plate 304, and a diaphragm 306 disposed on a common substrate 302 (e.g., bulk, die, or wafer). Sound from the exterior environment enters separate front volumes 322 for each motor 106, while the back volume 324 is shared amongst the motors 106.

A small opening 308 may be formed in the common substrate 302 itself, rather than in a separate layer. In this example, a large diameter opening 310 is formed through most of the thickness of the substrate, with just a thin portion containing the small opening. This shape allows tight control of the small opening 308 dimensions, which in turn gives tight control of the acoustic response and microphone self-noise. It also minimizes the risk of contamination of the opening.

Preferred embodiments of this invention are described herein, including the best mode known to the inventors for carrying out the invention. It should be understood that the illustrated embodiments are exemplary only, and should not be taken as limiting the scope of the invention.

What is claimed is:
1. A microphone comprising:
a base with a port extending through the base;
a support structure with a first surface and an opposing second surface, the first surface mounted to the base and around the port;
a plurality of microelectromechanical system (MEMS) motors mounted to the second surface of the support structure, wherein each of the plurality of MEMS motors comprises:
a diaphragm and
a back plate;

a cover mounted to the base, wherein the cover encloses the plurality of MEMS motors; and a vent extending through the support structure, wherein the vent has a first diameter at a first end and a second diameter at a second end, wherein the first diameter is smaller than the second diameter, wherein a back volume is defined, at least in part, by an inside surface of the cover, an inside surface of the base, and an inside surface of each of the plurality of MEMS motors, wherein the back volume is in communication with an outside environment via the vent, and wherein the port is configured to allow acoustic energy to pass through the port and move each of the diaphragms with respect to the respective back plate.

2. The microphone of claim 1, wherein the first end of the vent is in communication with the back volume, and wherein the second end of the vent is in communication with the outside environment.

3. The microphone of claim 1, wherein the first end of the vent has a first length, wherein the second end of the vent has a second length, and wherein the second length is greater than the first length.

4. The microphone of claim 1, wherein the first end of the vent is formed via a layer of material comprising the back plates of the plurality of the MEMS motors.

5. The microphone of claim 1, wherein the first end of the vent and the second end of the vent are formed in the support structure.

6. The microphone of claim 1, wherein the first diameter is 10 to 40 micrometers.

7. The microphone of claim 6, wherein the second diameter is 80 micrometers.

8. The microphone of claim 1, wherein the diaphragms of the plurality of MEMS motors are silicon.

9. The microphone of claim 8, wherein the support structure is silicon.

10. The microphone of claim 1, wherein a material layer comprises the back plates of the plurality of MEMS motors.

11. The microphone of claim 10, wherein the material layer is silicon nitride.

12. The microphone of claim 1, wherein the support structure forms a plurality of front volumes that are each in communication with the outside environment, and wherein each of the plurality of front volumes corresponds to a respective MEMS motor.

13. The microphone of claim 1, further comprising a circuit that is configured to convert movement of each of the diaphragms with respect to the respective back plate into an electrical signal, the circuit mounted to the base.

14. The microphone of claim 1, wherein the plurality of MEMS motors is four MEMS motors, and wherein the vent is located in between the four MEMS motors.

15. The microphone of claim 14, wherein the vent is coaxial with the port.

16. The microphone of claim 1, wherein each of the back plates comprise at least one perforation.

17. The microphone of claim 1, wherein the vent is between at least two of the diaphragms.

18. The microphone of claim 17, wherein the vent does not pass through any of the diaphragms.

19. A system comprising:
a base with a port extending through the base;
a support structure with a first surface and an opposing second surface, the first surface mounted to the base and around the port;
a plurality of microelectromechanical system (MEMS) motors mounted to the second surface of the support structure, wherein each of the plurality of MEMS motors comprises:
a diaphragm and
a back plate;
a cover mounted to the base, wherein the cover encloses the plurality of MEMS motors; and
a vent extending through the support structure and between the plurality of MEMS motors, wherein the vent has a first diameter at a first end and a second diameter at a second end, wherein the first diameter is smaller than the second diameter,
wherein a back volume is defined, at least in part, by an inside surface of the cover, an inside surface of the base, and an inside surface of each of the plurality of MEMS motors, wherein the back volume is in communication with an outside environment via the vent, and
wherein the port is configured to allow acoustic energy to pass through the port and move each of the diaphragms with respect to the respective back plate.

20. The system of claim 19, wherein the first end of the vent is in communication with the back volume, and wherein the second end of the vent is in communication with the outside environment.

* * * * *